United States Patent [19]
Lee

[11] Patent Number: 5,883,846
[45] Date of Patent: Mar. 16, 1999

[54] LATCH TYPE SENSE AMPLIFIER HAVING A NEGATIVE FEEDBACK DEVICE

[75] Inventor: Sang-Hyun Lee, Kyunggi-Do, Rep. of Korea

[73] Assignee: LG Semicon Co., Ltd., Cheongju-si, Rep. of Korea

[21] Appl. No.: 901,627

[22] Filed: Jul. 28, 1997

[30] Foreign Application Priority Data

Jul. 29, 1996 [KR] Rep. of Korea .................. 1996 30947

[51] Int. Cl.⁶ .................................................. G11C 7/02
[52] U.S. Cl. ..................... 365/207; 365/189.05; 365/205
[58] Field of Search ............................. 365/208, 230.06, 365/207, 205, 203, 189.05

[56] References Cited

U.S. PATENT DOCUMENTS

| 5,278,790 | 1/1994 | Kanabara | 365/230.06 |
| 5,457,657 | 10/1995 | Suh | 365/205 |
| 5,502,680 | 3/1996 | Du et al. | 365/207 |
| 5,615,161 | 3/1997 | Mu | 365/208 |

OTHER PUBLICATIONS

Tsuguo Kobayashi et al.; "A Current-mode Latch Sense Amplifier and a Static Power Saving Input Buffer for Low-power Architecture;" 1992 Symposium on VLSI Circuits Digest of Technical Papers; pp. 28–29.

Fumio Miyaji et al.; "A 25-ns 4-Mbit CMOS SRAM with Dynamic Bit-Line Loads;" 1989 IEEE.

*Primary Examiner*—David Nelms
*Assistant Examiner*—David Lam
*Attorney, Agent, or Firm*—Fleshner & Kim

[57] ABSTRACT

A latch type sense amplifier having negative feedback means for use in a memory device includes a first switching unit which is turned on/off by an enable signal and initializes a system operation at a turn-on operation; a second switching unit which is turned on/off according to the voltage state of the data on two data lines at the turn-on operation of the first switching unit and performs a system initial operation; a third switching unit which is turned on by a precharge signal and initializes two output signals; a latch unit for latching the data input via the second switching unit according to the operation of the third switching unit and outputting the latched data to two data output units; and a feedback switching unit which is connected to the data output units of the latch unit and the data lines, is turned on/off according to the voltage state of the other data output unit and pulls-up the voltage difference of the bit line connected to corresponding data line by the voltage on corresponding data output terminal at an on operation.

6 Claims, 7 Drawing Sheets

FIG. 6A WL,YSW

FIG. 6B CDEQ,DTEQ

FIG. 6C SAC,SAEQ

FIG. 6D BIT,BITB      dV3  dV4      dV5

FIG. 6E SOUT,SOUTB

LATCH TYPE SENSE AMPLIFIER HAVING A NEGATIVE FEEDBACK DEVICE

BACKGROUND OF THE INVENTION

1. Field of the Invention

The present invention relates to sense amplifiers for use in memory devices, and more particularly to a latch type sense amplifier which has a negative feedback device to connect the bit lines to the output unit of the sense amplifier after the sense amplifier is enabled.

2. Discussion of Related Art

Generally, a sense amplifier is a circuit for detecting the voltage or current level of an input signal by a threshold voltage and then amplifying it and in some cases, it includes the function of detecting only the input signal of a predetermined time period.

This sense amplifier is generally used for a minute output signal of a memory device.

A typical type of sense amplifiers used in memory devices as described above is a latch type, and a current driving latch type sense amplifier is shown in FIG. 1.

FIG. 1 is a circuit diagram showing a latch type sense amplifier according to a prior art. The sense amplifier is comprised of third and fourth PMOS transistors MP3 and MP4 which have their source terminals connected a predetermined positive voltage VCC and are turned on/off by a precharge signal SEAQ applied to their gate terminals; a first PMOS transistor MP1 which has a source terminal connected to the positive voltage VCC and a drain terminal connected to the drain terminal of the fourth PMOS transistor MP4 and is turned on/off by the voltage of the drain terminal of the third PMOS transistor MP3 applied to its gate terminal; a second PMOS transistor MP2 which has a source terminal connected to the positive voltage VCC and a drain terminal connected to the drain terminal of the third PMOS transistor MP3 and is turned on/off by the voltage of the common drain terminal of the fourth and first PMOS transistors MP4 and MP1 applied to its gate terminal; a fourth NMOS transistor MN4 which has a drain terminal connected to the common drain terminal of the fourth and first PMOS transistors MP4 and MP1 and a gate terminal connected to the common drain terminal of the third and second PMOS transistors MP3 and MP2; a fifth NMOS transistor MN5 which has a drain terminal connected to the common drain terminal of the third and second PMOS transistors MP3 and MP2 and a gate terminal connected to the common drain terminal of the fourth and first PMOS transistors MP4 and MP1; a second NMOS transistor MN2 which has a drain terminal connected to the source terminal of the fourth NMOS transistor MN4 and a gate terminal connected to a first data line DATA; a third NMOS transistor MN3 which has a drain terminal connected to the source terminal of the fifth NMOS transistor MN5, a gate terminal connected to a second data line DATAB and a source terminal connected to the source terminal of the second NMOS transistor MN2; and a first NMOS transistor MN1 which has a drain terminal connected to the common source terminal of the second and third NMOS transistors MN2 and MN3 and a gate terminal connected to an enable signal SAC.

The operation of the above described current driving latch type sense amplifier is as follows.

The first NMOS transistor MN1 is turned on/off by the enable signal SAC, and if the first NMOS transistor MN1 is turned on, the sense amplifier starts operating. The second and third NMOS transistors MN2 and MN3 input data read-out from the memory cells (not shown) via the first and second data lines DATA and DATAB and then perform an initial operation of the sense amplifier. The fourth and fifth NMOS transistors MN4 and MN5 and the first and second PMOS transistors MP1 and MP2 constitute a latch unit, and the third and fourth PMOS transistors MP3 and MP4 are means which is turned on by the precharge signal SEAQ and initializes the potential of the output signals SOUT and SOUTB.

FIG. 2 shows a memory read circuit utilizing the prior art sense amplifier as described above. Referring to FIG. 2, the memory read circuit includes a memory cell 50 which stores data having opposite value to each other and outputs the stored data via the bit lines BIT and BITB according to the voltage state of the word line WL by the combination of the designated row addresses; a bit line precharge circuit 40 connected in parallel to the bit lines BIT and BITB connected to the memory cell 50, for precharging and equalizing the bit lines BIT and BITB by a control signal DTEQ; a column selecting circuit 30 controlled by a first column selection signal YSW and a second column selection signal YSWB having an opposite phase to the first column selecting signal YSW, for connecting the bit lines BIT and BITB to the data lines DATA and DATAB; a data line precharge circuit 20 connected in parallel to the data lines DATA and DATAB connected to the column selecting circuit 30, for precharging and equalizing the data lines DATA and DATAB by a control signal CDEQ; and a sense amplifier 10 for amplifying and outputting the data input via the data lines DATA and DATAB.

Only one memory cell 50 is shown in FIG. 2, however, a plurality of memory cells are actually connected in parallel to the bit lines BIT and BITB.

Hereinbelow, the operation of the memory read circuit as described above will be discussed.

If a word line WL is selected by a combination of the designated row addresses and a bit line is selected by a combination of the column addresses, that is, if the first column selection signal YSW is at a logic high state and the second column selection signal YSWB is at a logic low state, the data stored at the memory cell 50 are applied to an input unit of the sense amplifier 10 via the bit lines BIT, BITB and the data lines DATA, DATAB.

The bit line precharge circuit 40 is for precharging the voltage level of the bit lines BIT, BITB before the selected word line is enabled. That is, the PMOS transistors MP21 and MP22 serve to pull-up the bit lines BIT, BITB to a predetermined positive voltage VCC and the PMOS transistor MP25 serves to equalize the voltage difference between the bit lines BIT and BITB. In addition, the PMOS transistors MP23 and MP24 make the bit lines BIT and BITB maintain the positive voltage VCC at a normal state and prevent the greater voltage difference between the bit lines BIT and BITB at a read operation.

The data line precharge circuit 20 has the same function as the bit line precharge circuit 40, and the function of the PMOS transistors MP11 to MP13 constituting the data line precharge circuit 20 corresponds to that of the PMOS transistors MP25, MP21 and MP22 in the bit line precharge circuit 40.

The functions and problems of the sense amplifier used in the prior art memory read circuit will be discussed in detail with reference to FIG. 3.

Before the sense amplifier 10 is enabled, the data lines DATA and DATAB are precharged to the positive voltage VCC and the enable signal SAC and the precharge signal SEAQ are at the logic low levels, as shown in (C) of FIG. 3. Thereby, the first NMOS transistor MN1 is disabled, thus isolating the path for discharging the output node, and the third and fourth PMOS transistors MP3 and MP4 are turned on, thus raising the potentials of the both outputs to the positive voltage VCC level.

After the word line and column line are opened and the precharge operation for the bit lines and data lines is completed, i.e., if the control signals CDEQ and DTEQ input to the precharge circuits 20 and 30 for precharging the data lines and bit lines go to the logic high levels, as shown in (B) of FIG. 3, the voltage of the bit line connected to the low node of the memory cell 50 is lowered, thus generating the voltage difference between the bit lines BIT and BITB.

After delaying for a predetermined time, the enable signal SAC and the precharge signal SEAQ go to the logic high levels and thus the precharge operation for the sense amplifier 10 is completed and the sense amplifier starts sensing the input voltage difference (see (C) of FIG. 3). The minimum voltage difference dV1 (see (D) of FIG. 3) for preventing the malfunction of the sense amplifier 10 is identical to an offset voltage Vdffset generated by the asymmetrical element of the sense amplifier 10.

The second and third NMOS transistors MN2 and MN3 used as the input unit of the sense amplifier 10 convert the voltage difference between the data lines DATA and DATAB into the current difference. This converted current difference varies the discharging speed of the output unit, thereby generating the voltage difference between the both nodes of the output unit. The latch unit comprised of the fourth and fifth NMOS transistors MN4 and MN5 and the first and second PMOS transistors MP1 and MP2 decreases the voltage difference of the output unit, allowing a higher speed latching of the output unit.

If the voltage of the first data line DATA is higher than that of the second data line DATAB, the first output signal SOUT is latched to a logic high level and the second output signal SOUTB is latched to a logic low level. Once the output signals are latched, the first output signal SOUT maintains the logic high state by the second PMOS transistor MP2, thus turning off the fifth NMOS transistor MN5, and the second output signal SOUTB maintains the logic low state by the first, second and fourth NMOS transistors MN1, MN2 and MN4, thus turning off the first PMOS transistor MP1.

After the sense amplifier 10 is latched, the latched state is not changed even when the voltage difference between the data lines DATA and DATAB is changed. Thus, the latch type sense amplifier as described can achieve an operational stability.

On the contrary, if there occurs an asymmetry in the sense amplifier 10, the voltage difference as high as can compensate the offset voltage must be applied to the input unit, and this means that the sense amplifier must be enabled after there generates that much voltage difference between the bit lines after the word line is selected.

In order to reduce the time delay according thereto, the equalizing resistance of the PMOS transistors MP23 and MP24 having a DC pull-up function in the bit line precharge circuit 40 must be great.

However, as shown in FIG. 3, the voltage difference of the bit line pair is continuously increased even after the sense amplifier 10 is latched and then saturated at the value dV2 (see (D) of FIG. 3), and this value is determined according to the current driving power of the memory cell and the current driving power of the DC pull-up.

It is preferable to make the value dV2 small for a fast precharging of the bit lines when the read operation for another memory cell data starts by the address conversion. For this, the equalizing resistance of the DC pull-up must be small.

As described above, the prior art has a problem of conflicting requirements that the equalizing resistance of the DC pull-up must be great to reduce the time delay associated with the enable of the sense amplifier, while the equalizing resistance of the DC pull-up must be small for a fast precharge speed at an address conversion.

SUMMARY OF THE INVENTION

Accordingly, the present invention is directed to a latch type sense amplifier having a negative feedback device that substantially obviates one or more of the problems due to limitations and disadvantages of the related art.

An object of the present invention is to provide a latch type sense amplifier having a negative feedback device which can prevent the voltage difference of the bit line pair from being increased than needed, by connecting the output unit of the sense amplifier to the bit lines by the negative feedback device after the latch type sense amplifier is enabled.

Another object of the present invention is to provide a memory read circuit to which a latch type sense amplifier having a negative feedback device can be applied.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a latch type sense amplifier having negative feedback means for use in a memory device includes a first switching unit which is turned on/off by an enable signal and initializes a system operation at a turn-on operation; a second switching unit which is turned on/off according to the voltage state of the data on two data lines at the turn-on operation of the first switching unit and performs a system initial operation; a third switching unit which is turned on by a precharge signal and initializes two output signals; a latch unit for latching the data input via the second switching unit according to the operation of the third switching unit and outputting the latched data to two data output units; and a feedback switching unit which is connected to the data output units of the latch unit and the data lines, is turned on/off according to the voltage state of the other data output unit and pulls-up the voltage difference of the bit line connected to corresponding data line by the voltage on corresponding data output terminal at an on operation.

In another aspect of the present invention, a memory read circuit having a plurality of memory cells which store data having opposite value to each other and output the stored data via bit lines according to the voltage state of a word line by a combination of designated row addresses; a bit line precharge unit connected in parallel to the bit lines connected to the memory cells, for precharging and equalizing the bit lines by control signals; a column selecting unit controlled by a first column selection signal and a second column selection signal having an opposite phase to the first column selection signal, for connecting the bit lines to data lines; a data line precharge unit connected in parallel to the data lines connected to the column selecting unit, for precharging and equalizing the data lines by control signals; and a sense amplifier for amplifying the data input via the data lines, is characterized in that the sense amplifier has a feedback switching unit which is connected to the data output units of the sense amplifier and the data lines, performs an on/off operation by a predetermined control signal which senses that the voltage difference of the bit lines connected to the data lines is over a predetermined value, and pulls-up the voltage of the bit line connected to corresponding data line by the voltage on corresponding data output unit at an on operation, and the bit line precharge unit comprises a switching unit which performs an on/off operation according to the first column selection signal applied to the column selecting unit and pulls-up corresponding bit line to a predetermined positive voltage at an on operation and is constructed to have a significantly great equalizing resistance for a fast discharging of a low node of the bit line pair after a word line is selected.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 6 is a waveform showing the operations of main parts of FIG. 5; and

DETAILED DESCRIPTION OF PREFERRED EMBODIMENT

Reference will now be made in detail to the preferred embodiments of the present invention, examples of which are illustrated in the accompanying drawings.

Figure 4:
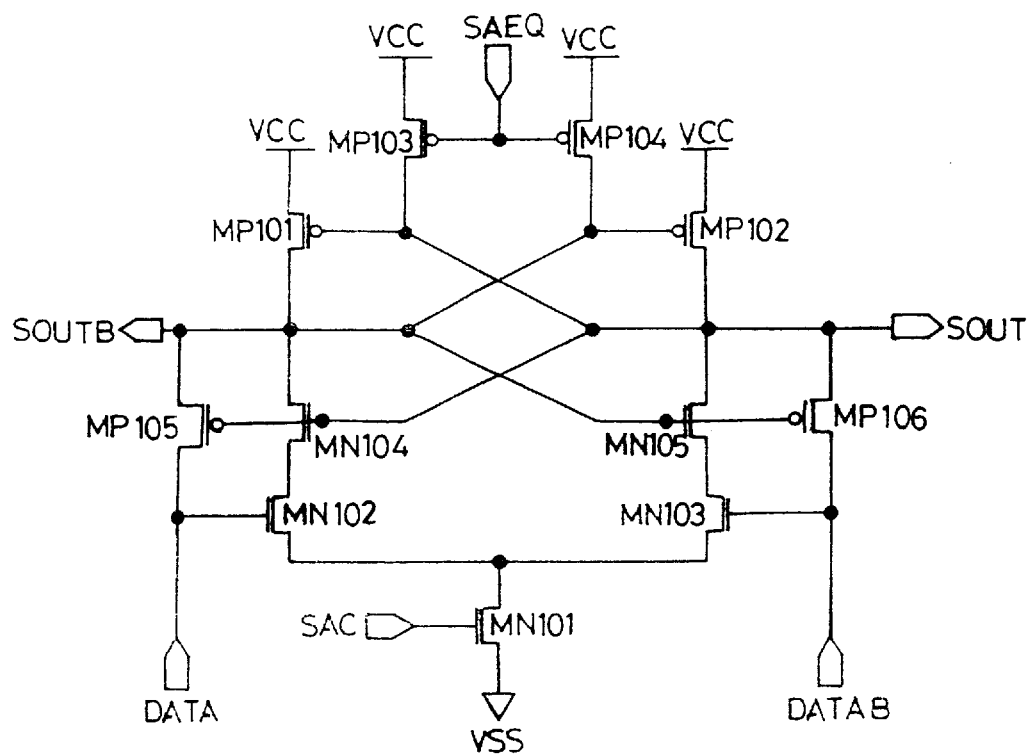
FIG. 4 is a circuit diagram showing a latch type sense amplifier according to the present invention.

FIG. 4 is a circuit diagram showing a latch type sense amplifier according to the present invention. The sense amplifier of FIG. 4 is comprised of third and fourth PMOS transistors MP103, MP104 which have their source terminals connected a predetermined positive voltage VCC and their gate terminals commonly applied with a precharge signal SEAQ; a first PMOS transistor MP101 which has a source terminal connected to the positive voltage VCC, a gate terminal applied with the voltage of the drain terminal of the third PMOS transistor MP103 and a drain terminal connected to the drain terminal of the fourth PMOS transistor MP104; a second PMOS transistor MP102 which has a source terminal connected to the positive voltage VCC, a gate terminal applied with the voltage of the common drain terminal of the fourth and first PMOS transistors MP104 and MP101 and a drain terminal connected to the drain terminal of the third PMOS transistor MP103; a fourth NMOS transistor MN104 which has a drain terminal connected to the common drain terminal of the fourth and first PMOS transistors MP104 and MP101 and a gate terminal connected to the common drain terminal of the third and second PMOS transistors MP103 and MP102; a fifth NMOS transistor MN105 which has a drain terminal connected to the common drain terminal of the third and second PMOS transistors MP103 and MP102 and a gate terminal connected to the common drain terminal of the fourth and first PMOS transistors MP104 and MP101; a second NMOS transistor MN2 which has a drain terminal connected to the source terminal of the fourth NMOS transistor MN104 and a gate terminal connected to a first data line DATA; a third NMOS transistor MN103 which has a drain terminal connected to the source terminal of the fifth NMOS transistor MN105, a gate terminal connected to a second data line DATAB and a source terminal connected to the source terminal of the second NMOS transistor MN102; a first NMOS transistor MN101 which has a drain terminal connected to the common source terminal of the second and third NMOS transistors MN102 and MN103 and a gate terminal connected to an enable signal SAC; a fifth PMOS transistor MP105 which has a source terminal connected to the common-drain terminal of the first and fourth PMOS transistors MP101 and MP104 used as a second output unit and a gate terminal connected to the signal applied to the gate terminal of the fourth NMOS transistor MN104 and outputs the voltage of the source terminal to the drain terminal thereof connected to the first data line DATA connected to the gate terminal of the second NMOS transistor MN102 at an on operation; and a sixth PMOS transistor MP106 which has a source terminal connected to the common drain terminal of the second and third PMOS transistors MP102 and MP102 used as a first output unit and a gate terminal connected to the signal applied to the gate terminal of the fifth NMOS transistor MN105 and outputs the voltage of the source terminal to the drain terminal thereof connected to the second data line DATAB connected to the gate terminal of the third NMOS transistor MN103 at an on operation.

Figure 1:
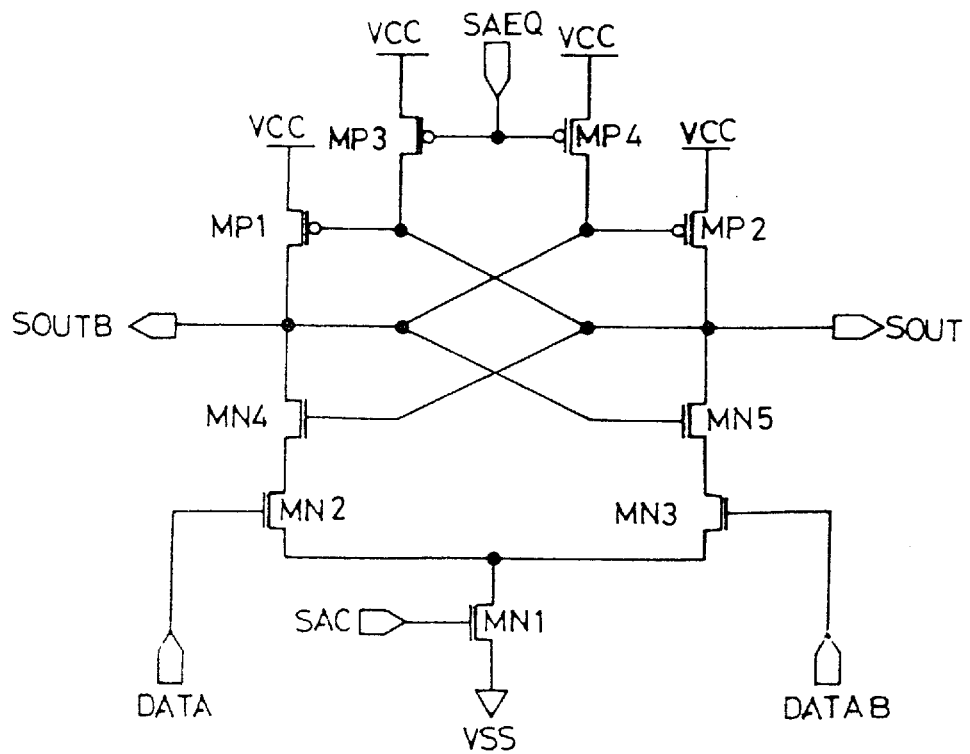
FIG. 1 is a circuit diagram showing a latch type sense amplifier according to a prior art.

The sense amplifier of FIG. 4 is different from that of FIG. 1 in that the sense amplifier of FIG. 4 further comprises PMOS transistors MP105 and MP106 for a feedback function between the output units of the sense amplifier and the data lines.

Figure 5:
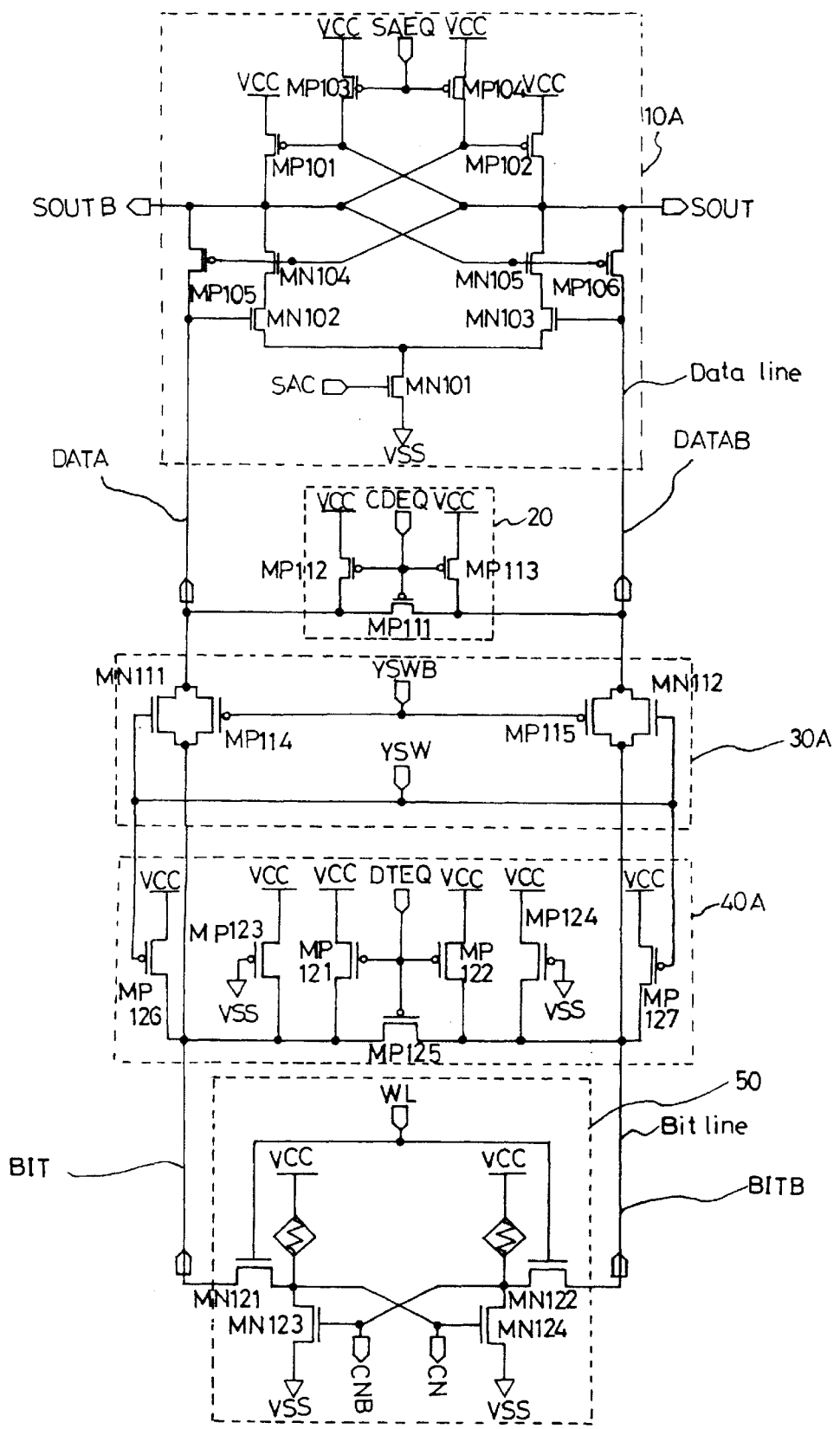
FIG. 5 is a circuit diagram showing a memory read circuit utilizing the sense amplifier of FIG. 4.

FIG. 5 is a circuit diagram showing a memory read circuit using the sense amplifier according to the present invention.

Figure 2:
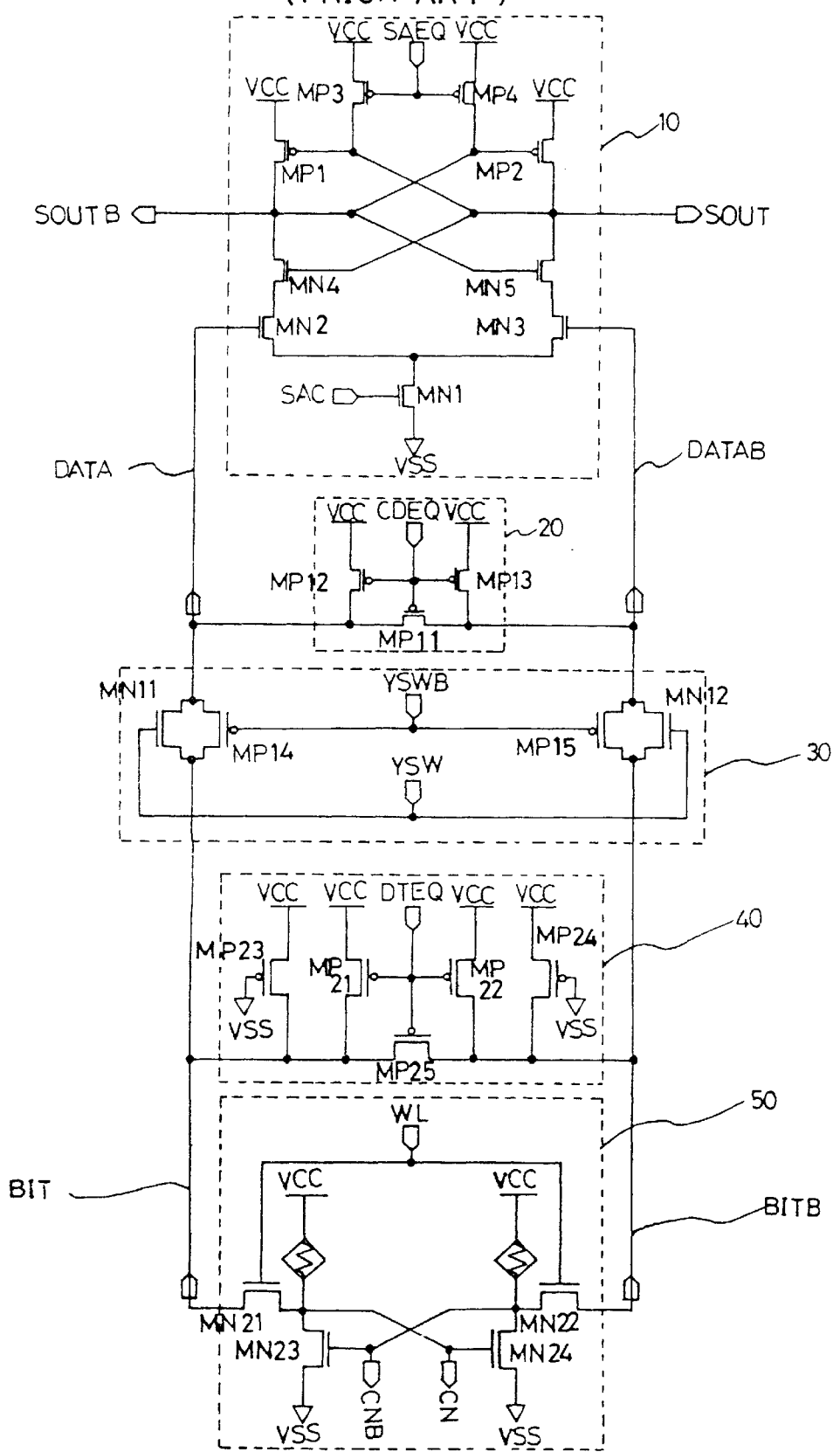
FIG. 2 is a circuit diagram showing a memory read circuit utilizing the sense amplifier of FIG. 1.

The difference between the memory read circuit of FIG. 5 and that of FIG. 2 is that the memory read circuit of FIG. 5 further comprises PMOS transistors MP126 and MP127 in the bit line precharge circuit 40A which are turned on by the first column selection signal YSW of the column selecting circuit 30A and precharge the bit lines to a predetermined positive voltage VCC.

The basic operation of the sense amplifier and memory read circuit of FIGS. 4 and 5 is identical to that of FIGS. 1 and 2, and thus the detailed description thereof will be omitted. Instead, the operation of the circuit of the present invention corresponding to the problem of the prior art will be discussed hereinbelow with reference to FIG. 6.

If the sense amplifier 10A is at a precharge state, the fifth and sixth PMOS transistors MP105 and MP106 are turned off.

If the sense amplifier 10A is enabled and the output thereof is latched, one of the fifth and sixth PMOS transistors MP105 and MP106 is turned on.

In this case, if the voltage of the first data line DATA is higher than that of the second data line DATAB and thus the first output signal SOUT is at the logic high state and the second output signal SOUTB is at the logic low state, the fifth PMOS transistor MP105 is turned off and the sixth PMOS transistor MP106 is turned on.

Thereby, the current flowing via the second and sixth PMOS transistors MP102 and MP106 charges the second data line DATAB, raising the voltage level of the second data line DATAB. Thus, the voltage difference between the first and second data lines DATA and DATAB is reduced and consequentially the voltage difference between the bit lines BIT and BITB is also reduced (see (D) of FIG. 6).

Therefore, it has an advantage of reducing the bit line precharge time at an address conversion.

In the memory read circuit proposed to utilize the negative feedback feature of the sense amplifier 10A as described above, the PMOS transistors MP123 and MP124 performing a DC pull-up function in the bit line precharge circuit 30A have an increased equalizing resistance as compared with the prior art, and this enables a fast discharge of the low node of the bit line pair after the word line is selected.

Therefore, it is possible to reduce the delay time required in reaching the offset voltage (see (D) of FIG. 6). In some cases, it is also possible to design the circuit not to have the DC pull-up MP123 and MP124 at the bit lines.

The voltage difference of the bit lines of the selected column is reduced by the feedback device of the sense amplifier as described. In the meanwhile, if the voltage difference of the bit line pair of the unselected column is increased, the equalizing resistance of the DC pull-up becomes significantly great. Thus, there needs to prevent the significant increase of the voltage difference of the bit line pair.

To achieve this object, the bit line precharge circuit 40A further comprises the bit line pull-up means MP126 and MP127 controlled by the first column selection signal YSW of the column selecting circuit 30A.

In the case that the column is selected, the PMOS transistors MP126 and MP127 are turned off and thus the read operation is performed as described above.

In the meanwhile, if the column is not selected, the PMOS transistors MP126 and MP127 are turned on. Since the current driving power of the pull-up means is much higher than that of the memory cell, the voltage difference of the bit line pair becomes small.

Therefore, with the latch type sense amplifier having the negative feedback device of the present invention and the memory read circuit according thereto, it is possible to solve the prior art problem of the conflicting requirements that the equalizing resistance of the DC pull-up must be great to reduce the delay time associated with the enable of the sense amplifier, while the equalizing resistance of the DC pull-up must be small for a fast precharge speed at an address conversion.

The sense amplifier of the present invention is featured in that the output signals SOUT and SOUTB of the sense amplifier are fedback to the data lines and are used as control signals.

Figure 7:
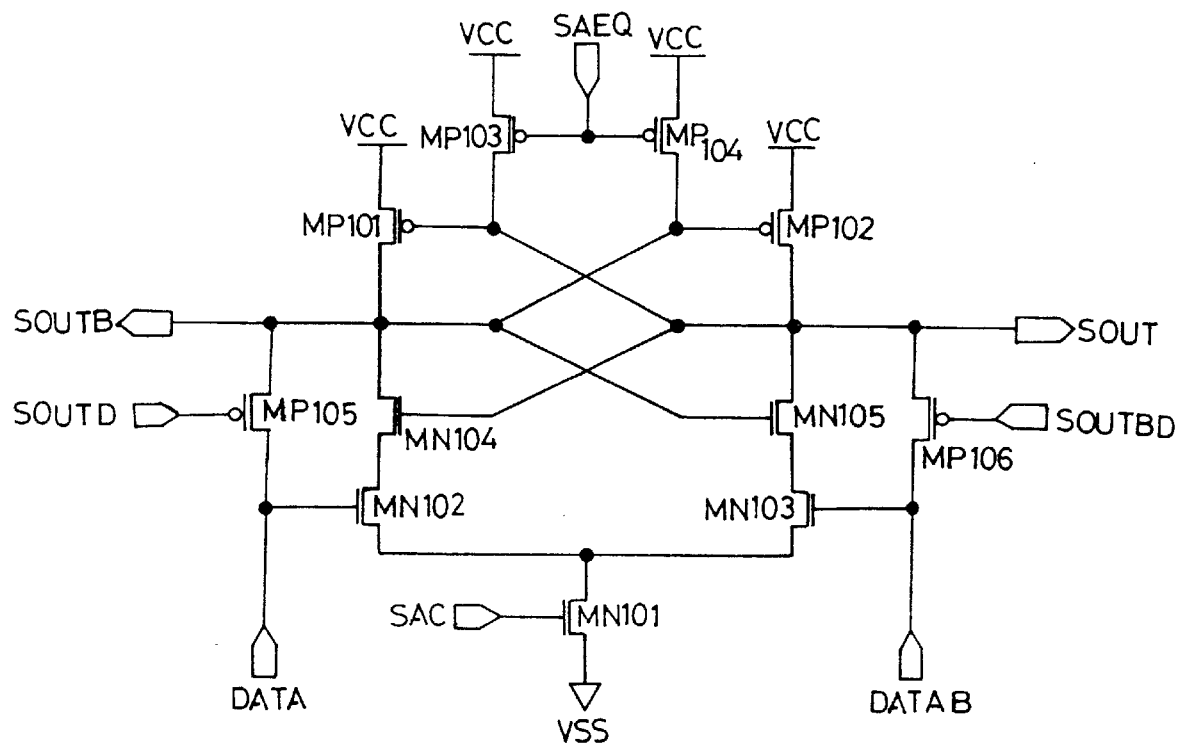
FIG. 7 is a circuit diagram showing a latch type sense amplifier according to another preferred embodiment of the present invention.

FIG. 7 is a circuit diagram showing a latch type sense amplifier according to another preferred embodiment of the present invention. The feature of the sense amplifier of FIG. 7 is that the output unit of the sense amplifier is isolated from the data lines before the latch operation is completed, and this enables a faster latch operation as compared with the sense amplifier of FIG. 4.

In the meanwhile, the sense amplifier of FIG. 7 has a disadvantage that the voltage difference of the bit line pair is increased right before the feedback and this causes a slow bit line precharging speed when there occurs an address asymmetry.

Figure 3:
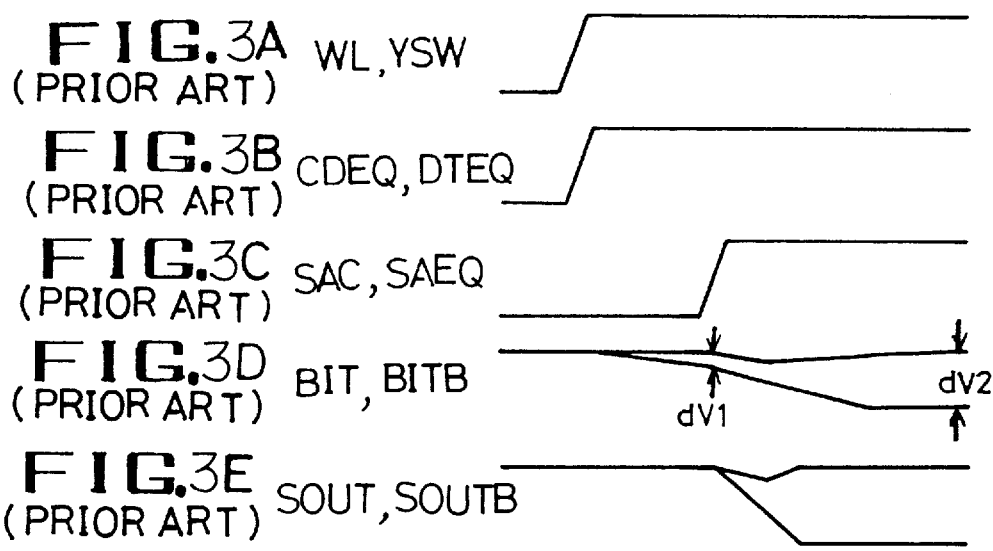
FIG. 3 is a waveform showing the operations of main parts of FIG. 2.

However, since the increased value dV4 of the voltage difference of the bit line pair right before the feedback is smaller than the maximum value (see dV2 in (D) of FIG. 3) of the voltage difference of the bit line pair, the sense amplifier of FIG. 7 has an improved effect as compared with the prior art.

It will be apparent to those skilled in the art that various modifications and variations can be made in a latch type sense amplifier having a negative feedback device of the present invention without departing from the spirit or scope of the invention. Thus, it is intended that the present invention cover the modifications and variations of this invention provided they come within the scope of the appended claims and their equivalents.

What is claimed is:

1. A latch type sense amplifier having a negative feedback circuit for use in a memory device, comprising:
    a first switching circuit that is turned on/off by an enable signal and initializes a system operation at a turn-on operation;
    a second switching circuit that is turned on/off according to the voltage state of the data on two data lines at the turn-on operation of said first switching circuit and performs a system initial operation;
    a third switching circuit that is turned on by a precharge signal and initializes two output signals;
    a latch unit that latches the data input via said second switching circuit according to the operation of said third switching circuit and outputs the latched data to two data output units; and
    a feedback switching circuit that is connected to said data output units of said latch unit and said data lines is turned on/off according to the voltage state of the data output units and reduces the voltage difference of bit lines connected to corresponding data lines at an on operation.

2. The latch type sense amplifier of claim 1, wherein a first part of the feedback switching circuit is respectively connected to one pair of said two data output units and said two data lines and a second part of the feedback switching circuit is connected to the other pair of said two data output units and said two data lines, wherein the first part coupled to one data line is turned on/off according to a voltage state of the data line coupled to the second part to reduce the voltage difference between the bit lines by the voltage of the corresponding data output terminal.

3. A latch type sense amplifier having negative feedback means for use in a memory device, comprising:
    first switching means which is turned on/off by an enable signal for initializing a system operation at a turn-on operation;
    second switching means which is turned on/off according to the voltage state of the data on two data lines at the turn-on operation of said first switching means for performing a system initial operation;
    third switching means which is turned on by a precharge signal for initializing two output signals;

latch means for latching the data input via said second switching means according to the operation of said third switching means and outputting the latched data to two data output units; and feedback switching means which is connected to said data output units of said latch means and said data lines, is turned on/off according to an external control signal, for reducing a voltage difference between the data lines and corresponding bit lines by pulling-up one data line and the bit line connected to the one data line by the voltage on a corresponding data output terminal at an enable operation.

4. The latch type sense amplifier as claimed in claim 3, wherein the output signal of a delay circuit is used as the control signal for an on/off operation of said feedback switching means.

5. A memory read circuit comprising:

a plurality of memory cells that store data having opposite value to each other and output the stored data via bit lines according to the voltage state of a word line by a combination of designated row addresses;

a bit line precharge unit connected in parallel to said bit lines connected to said memory cells that precharges and equalizes said bit lines by control signals;

a column selecting unit controlled by a first column selection signal and a second column selection signal having an opposite phase to said first column selection signal that connects said bit lines to data lines;

a data line precharge unit connected in parallel to said data lines connected to said column selecting unit that precharges and equalizes said data lines by control signals; and a sense amplifier that amplifies the data input via said data lines, wherein said sense amplifier comprises, a feedback circuit connected to the data output units of said sense amplifier and said data lines that performs an on/off operation by a predetermined control signal that senses that the voltage difference of said bit lines connected to said data lines is over a predetermined value, and pulls-up the voltage of the bit line connected to corresponding data line by the voltage on corresponding data output unit at an on operation, and wherein said bit line precharge unit comprises a switching circuit that performs an on/off operation according to said first column selection signal to select one of first and second levels of equalizing resistance, wherein the first level is greater than the second level, and wherein the switching circuit pulls-up corresponding bit line to a predetermined positive voltage at an on operation.

6. The memory read circuit of claim 5, wherein the first level reduces an enabling time of the sense amplifier, wherein the second level reduces a precharging time of the bit lines for a read operation, and wherein the feedback circuit reduces a voltage difference on the bit lines.

* * * * *